US007161356B1

(12) United States Patent
Chien

(10) Patent No.: US 7,161,356 B1
(45) Date of Patent: Jan. 9, 2007

(54) VOLTAGE/CURRENT TESTING EQUIPMENT FOR MICROFLUIDIC DEVICES

(75) Inventor: Ring-Ling Chien, San Jose, CA (US)

(73) Assignee: Caliper Life Sciences, Inc., Mountain View, CA (US)

( * ) Notice: Subject to any disclaimer, the term of this patent is extended or adjusted under 35 U.S.C. 154(b) by 635 days.

(21) Appl. No.: 10/435,947

(22) Filed: May 12, 2003

Related U.S. Application Data

(60) Provisional application No. 60/386,038, filed on Jun. 5, 2002.

(51) Int. Cl.
*G01R 31/08* (2006.01)
*G01N 27/00* (2006.01)

(52) U.S. Cl. ....................... 324/523; 324/512; 204/603

(58) Field of Classification Search ................ 324/523, 324/93, 512; 204/603
See application file for complete search history.

(56) References Cited

U.S. PATENT DOCUMENTS 4,390,403 A 6/1983 Batchelder
4,908,112 A 3/1990 Pace
5,126,022 A 6/1992 Soane et al.
5,321,354 A * 6/1994 Ooshima et al. ............ 324/765
5,369,420 A * 11/1994 Bartky ....................... 324/512
5,498,392 A 3/1996 Wilding et al.
5,571,410 A 11/1996 Swedberg et al.
5,585,069 A 12/1996 Zanzucchi et al.
5,593,838 A 1/1997 Zanzucchi et al.
5,603,351 A 2/1997 Cherukuri et al.
5,635,358 A 6/1997 Wilding et al.
5,637,469 A 6/1997 Wilding et al.

(Continued)

FOREIGN PATENT DOCUMENTS

WO WO-9604547 2/1996

(Continued)

OTHER PUBLICATIONS

Dasgupta, P.K. et al., "Electroosmosis: A Reliable Fluid Propulsion System for Flow Injection Analysis," *Anal. Chem.* (1994) 66:1792-1798.

(Continued)

*Primary Examiner*—Anjan Deb
(74) *Attorney, Agent, or Firm*—Donald R. McKenna; Ann C. Petersen

(57) ABSTRACT

The present invention provides novel methods and devices for testing/verifying the configuration of one or more microfluidic elements in a microfluidic device. In particular the methods and devices of the invention are useful in testing for blockages or the presence of air bubbles in microfluidic elements. For example, a method for verifying the proper function of a microfluidic device is disclosed, which device comprises at least first, second and third fluidic openings, which fluidic openings are fluidly coupled to at least first, second and third microscale channel elements, respectively, the method comprising flowing an electrically conductive buffer through the first, second and third microscale channel elements; setting a known applied voltage potential (or current) between the first and second fluidic openings; setting a current in the third microscale channel element to be approximately zero; detecting a resulting voltage at the third fluidic opening; and, comparing the detected voltage at the third fluidic opening with a calculated target voltage expected at the third fluidic opening to determine whether there is a fault or problem (e.g., air bubble) in at least one of the first and second microscale channel elements. The above method can be repeated one or more times for the other fluidic openings in the microfluidic device to determine whether there is a fault in any one or more microscale elements of the device.

13 Claims, 10 Drawing Sheets

U.S. PATENT DOCUMENTS

| | | | | |
|---|---|---|---|---|
| 5,699,157 | A | 12/1997 | Parce | |
| 5,716,852 | A | 2/1998 | Yager et al. | |
| 5,750,015 | A | 5/1998 | Soane et al. | |
| 5,800,690 | A | 9/1998 | Chow et al. | |
| 5,858,187 | A | 1/1999 | Ramsey et al. | |
| 5,858,195 | A | 1/1999 | Ramsey | |
| 5,869,004 | A | 2/1999 | Parce et al. | |
| 5,876,675 | A | 3/1999 | Kennedy | |
| 5,880,071 | A | 3/1999 | Parce et al. | |
| 5,882,465 | A | 3/1999 | McReynolds | |
| 5,885,470 | A | 3/1999 | Parce et al. | |
| 5,932,100 | A | 8/1999 | Yager et al. | |
| 5,942,443 | A | 8/1999 | Parce et al. | |
| 5,948,227 | A | 9/1999 | Dubrow | |
| 5,955,028 | A | 9/1999 | Chow | |
| 5,958,694 | A | 9/1999 | Nikiforov | |
| 5,959,291 | A | 9/1999 | Jensen | |
| 5,965,410 | A | 10/1999 | Chow et al. | |
| 5,976,336 | A | 11/1999 | Dubrow et al. | |
| 5,989,402 | A * | 11/1999 | Chow et al. | 204/601 |
| 6,001,229 | A | 12/1999 | Ramsey | |
| 6,001,231 | A | 12/1999 | Kopf-Sill | |
| 6,012,902 | A | 1/2000 | Parce | |
| 6,042,709 | A | 3/2000 | Parce et al. | |
| 6,062,261 | A | 5/2000 | Jacobson et al. | |
| 6,074,725 | A | 6/2000 | Kennedy | |
| 6,100,541 | A | 8/2000 | Nagle et al. | |
| 6,120,666 | A | 9/2000 | Jacobson et al. | |
| 6,221,226 | B1 | 4/2001 | Kopf-Sill | |
| 6,235,471 | B1 | 5/2001 | Knapp et al. | |
| 6,280,589 | B1 | 8/2001 | Manz et al. | |
| 2003/0094953 | A1* | 5/2003 | Brooks et al. | 324/441 |
| 2003/0226755 | A1* | 12/2003 | Ramsey | 204/600 |
| 2003/0230488 | A1* | 12/2003 | Lee et al. | 204/453 |
| 2005/0161326 | A1* | 7/2005 | Morita et al. | 204/450 |

FOREIGN PATENT DOCUMENTS

| | | |
|---|---|---|
| WO | WO-9702357 | 1/1997 |
| WO | WO-0200343 | 1/2002 |
| WO | WO-02057765 | 7/2002 |

OTHER PUBLICATIONS

Effenhauser, C.S. et al., "Glass Chips for High-Speed Capillary Electrophoresis Separations with Submicrometer Plate Heights," *Anal. Chem.* (1993) 65: 2637-2642.

Effenhauser, C.S. et al., "High Speed Separation of Anitsense Oligonucleotides on a Micromachined Capillary Electrophoresis Device," *Anal. Chem.* (1994) 66:2949-2953.

Effenhauser, C.S. et al., "Integrated Capillary Electrophoresis on Flexible Silicone Microdevices: Analysis of DNA Restriction Fragments and Detection of Single DNA Molecules on Microchips," *Anal. Chem.* (1997) 69: 3451-3457.

Fan, Z.H. et al., "Micromachining of Capillary Electrophoresis Injectors and Separators on Glass Chips and Evaluation of Flow at Capillary Intersections," *Anal. Chem.* (1994) 66: 177-184.

Fister, J.C. III et al., "Counting Single Chromophore Molecles for Ultrasensitive Analysis and Separations on Microchip Devices," *Anal. Chem.* (1998) 70: 431-437.

Hadd, A.G. et al., "Microfluidic Assays of Acetylcholinesterase," *Anal. Chem.* (1999) 71: 5206-5212.

Harrison, J. et al., "Capillary Electrophoresis and Sample Injection Systems Integrated on a Planar Glass Chip," *Anal. Chem.* (1992) 64: 1926-1932.

Harrison, J. et al., "Towards Miniaturized Electrophoresis and Chemical Analysis Systems on Silicon: An Alternative to Chemical Sensors*," *Sensors and Actuators B* (1993) 10: 107-116.

Harrison, J. et al., "Micromachining a Miniaturized Capillary Electrophoresis-Based Chemical Analysis System on a Chip," *Science* (1993) 261: 895-897.

Harrison, D.J. et al., "Integrated Electrophoresis Systems for Biochemical Analyses," *Solid-State Sensor and Actuator Workshop* (1994) 21-24.

Jacobson, S.C. et al., "Effects of Injection Schemes and Column Geometry on the Performance of Microchip Electrophoresis Devices," *Anal. Chem.* (1994) 66:1107-1113.

Jacobson, S.C. et al., "High-Speed Separations on a Microchip," *Anal. Chem.* (1994) 66: 1114-1118.

Jacobson, S.C. et al., "Open Channel Electrochromatography on a Microchip," *Anal. Chem.* (1994) 66: 2369-2373.

Jacobson, S.C. et al., "Precolumn Reactions with Electrophoretic Analysis Integrated on a Microchip," *Anal. Chem.* (1994) 66: 4127-4132.

Jacobson, S.C. et al., "Microchip Electrophoresis with Sample Stacking," *Electrophoresis* (1995) 16: 481-486.

Jacobson, S.C. et al., "Fused Quartz Substrates for Microchip Electrophoresis," *Anal. Chem.* (1995) 67: 2059-2063.

Jacobson, S.C. et al., "Integrated Microdevice for DNA Restriction Fragment Analysis," *Anal. Chem.* (1996) 68: 720-723.

Jacobson, S.C. et al., "Electrokinetic Focusing in Microfabricated Channel Structures," *Anal. Chem.* (1997) 69: 3212-3217.

Jacobson, S.C. et al., "Microfluidic Devices for Electrokinetically Driven Parallel and Serial Mixing," *Anal. Chem.* (1999) 71: 4455-4459.

Manz, A. et al., "Miniaturized Total Chemical Analysis Systems: a Novel Concept for Chemical Sensing," *Sensors and Actuators* (1990) B1: 244-248.

Manz, A. et al., "Micromachining of Monocrystalline Silicon and Glass for Chemical Analysis Systems," *Trends in Analytical Chemistry* (1991) 10:144-149.

Manz, A. et al., "Planar Chips Technology for Miniaturization and Integration of Separation Techiques into Monitoring Systems," *Journal of Chromatograhy* (1992) 593:253-258.

Manz, A. et al., "Planar Chips Technology for Miniaturization of Separation Systems: A Developing Perspective in Chemical Monitoring,".

Manz, A. et al., "Electroosmotic Pumping and Electrophoretic Separations for Miniaturized Chemical Analysis Systems," J. Micromach. Microeng. (1994) 4: 257-265.

Manz, A. et al., "Parallel Capillaries for High Throughput in Electrophoretic Separations and Electroosmotic Drug Discovery Systems," International Conference on Solid-State Sensors and Actuators (1997) 915-918.

McCormick, R.M. et al., "Microchannel Electrophoretic Separations of DNA in Injection-Molded Plastic Substrates," *Anal. Chem.* (1997) 69:2626-2630.

Moore, A.W. et al., "Microchip Separations of Neutral Species via Micellar Electrokinetic Capillary Chromatography," *Anal. Chem.* (1995) 67: 4184-4189.

Ramsey, J.M. et al., "Microfabricated Chemical Measurement Systems," *Nature Medicine* (1995) 1:1093-1096.

Salimi-Moosavi, H. et al., "Biology Lab-on-a-Chip for Drug Screening," Solid-State Sensor and Actuator Workshop (1998) 350-353.

Seiler, K. et al., "Planar Glass Chips for Capillary Electrophoresis: Repetitive Sample Injection, Quantitation, and Separation Efficiency," *Anal. Chem.* (1993) 65:1481-1488.

Seiler, K. et al., "Electroosmotic Pumping and Valveless Control of Fluid Flow within a Manifold of Capillaries on a Glass Chip," *Anal. Chem.* (1994) 66:3485-3491.

Ueda, M. et al., "Imaging of a Band for DNA Fragment Migrating in Microchannel on Integrated Microchip," *Materials Science and Engineering C* (2000) 12:33-36.

Wang, C. et al., "Integration of Immobilized Trypsin Bead Beds for Protein Degestion within a Microfluidic Chip Incorporating Capillary Electrophoresis Separations and an Electrospray Mass Spectrometry Interface," *Rapid Commin. Mass Spectrom.* (2000) 14:1377-1383.

Woolley, A.T. et al., "Ultra-High-Speed DNA Fragment Separations Using Microfabricated Capillary Array Electrophoresis Chips," *Proc. Natl. Acad. Sci. USA* (1994) 91:11348-11352.

Woolley, A.T. et al., "Functional Integration of PCR Amplification and Capillary Electrophoresis in a Microfabricated DNA Analysis Device," Anal. Chem. (1996) 68: 4081-4086.

Woolley, A.T. et al., "High-Speed DNA Genotyping Using Microfabricated Capillary Array Electrophoresis Chips," *Anal. Chem.* (1997) 69:2181-2186.

Woolley, A.T. et al., "Capillary Electrophoresis Chips with Integrated Electrochemical Detection," *Anal. Chem.* (1998) 70: 684-688.

Zhang, B. et al., "Microfabricated Devices for Capillary Electrophoresis-Electrospray Mass Spectrometry," *Anal. Chem.* (1999) 71:3258-3264.

* cited by examiner

LS211

| Electrode | Status | Applied Current | Applied Voltage | Target Current | Target Voltage | Symmetry conditions |
|---|---|---|---|---|---|---|
| 1 | well | | 2500V | -7 μA | | Electrode 1=Electrode 4 |
| 2 | well | | 200V | -7 μA | | Electrode 2=Electrode3 |
| 3 | well | | 200V | -7 μA | | Electrode 5=Electrode 16 |
| 4 | well | | 2500V | -7 μA | | Electrode 6=Electrode 7 |
| 5 | well | 0 μA | | | 1531V | Electrode 8=Electrode 15 |
| 6 | well | 0 μA | | | 1894V | Electrode 10=Electrode 11 |
| 7 | well | 0 μA | | | 1894V | Electrode 12=Electrode 13 |
| 8 | well | 0 μA | | | 1531V | Electrodes 5, 8, 10-13, |
| 9 | | | | | | 15 and 16 should have |
| 10 | sipper | 0 μA | | | 1531V | same voltage |
| 11 | sipper | 0 μA | | | 1531V | Electrodes 6 and 7 |
| 12 | sipper | 0 μA | | | 1531V | should have same voltage |
| 13 | sipper | 0 μA | | | 1531V | Electrodes 1 and 4 should |
| 14 | | | | | | have same current |
| 15 | well | 0 μA | | | 1531V | Electrodes 2 and 3 should |
| 16 | well | 0 μA | | | 1531V | have same current |

Fig. 9A

LS258

| Electrode | Status | Applied Current | Applied Voltage | Target Current | Target Voltage | Symmetry conditions |
|---|---|---|---|---|---|---|
| 1 | well | | 2500V | -7 μA | | Electrode 1=Electrode 4 |
| 2 | well | | 1000V | -7 μA | | Electrode 2=Electrode3 |
| 3 | well | | 1000V | -7 μA | | Electrode 6=Electrode 7 |
| 4 | well | | 2500V | -7 μA | | Electrode 10=Electrode 11 |
| 5 | | | | | | Electrode 12=Electrode 13 |
| 6 | well | 0 μA | | | 2263V | Electrodes 10-13 should |
| 7 | well | 0 μA | | | 2263V | have same voltage |
| 8 | | | | | | Electrodes 6 and 7 |
| 9 | | | | | | should have same voltage |
| 10 | sipper | 0 μA | | | 1552V | Electrodes 1 and 4 should |
| 11 | sipper | 0 μA | | | 1552V | have same current |
| 12 | sipper | 0 μA | | | 1552V | Electrodes 2 and 3 should |
| 13 | sipper | 0 μA | | | 1552V | have same current |
| 14 | | | | | | |
| 15 | | | | | | |
| 16 | | | | | | |

Fig. 9B

VOLTAGE/CURRENT TESTING EQUIPMENT FOR MICROFLUIDIC DEVICES

CROSS-REFERENCE TO RELATED APPLICATION

This application claims the benefit of U.S. Provisional Patent Application No. 60/386,038, filed Jun. 5, 2002, which is incorporated herein by reference in its entirety for all purposes.

BACKGROUND OF THE INVENTION

The performance of chemical or biochemical analyses, assays, or preparations often requires a large number of separate manipulations to be performed on the materials or components to be assayed, including measuring, aliquotting, transferring, diluting, mixing, separating, detecting, incubating, etc. Microfluidic technology miniaturizes these manipulations and integrates them so that they can be executed within one or a few microfluidic devices. For example, pioneering microfluidic methods of performing biological assays in microfluidic systems have been developed, such as those described by Parce et al., "High Throughput Screening Assay Systems in Microscale Fluidic Devices," U.S. Pat. No. 5,942,443 and Knapp et al., "Closed Loop Biochemical Analyzers," U.S. Pat. No. 6,235,471, the contents of which are incorporated by reference herein.

To perform such diverse and oftentimes complex manipulations, many examples of microfluidic devices comprise complex arrangements of numerous microfluidic elements (e.g., microchannels, wells, microreservoirs, etc.). Additionally, many examples of microfluidic devices incorporate capillary or other similar elements extending from the body structures of the devices. The microelements of microfluidic devices (whether "complex" or "simple" in arrangement or number) are often etched, micro-milled, etc. into substrates. Additionally, as part of the preparation/manufacture of microfluidic devices, the microfluidic elements, capillary elements, and the like, are often filled with a desired fluid, before the specific assays for which the microfluidic device was designed, are performed. Such construction and preparation of microfluidic devices gives rise to several possible concerns. For example, bubbles possibly can be trapped within the microfluidic device (e.g., within a junction or area where a capillary element joins/abuts a substrate layer of the microfluidic device, or within complex or intricate combinations of microfluidic elements, or within microchannels containing large changes in cross-sectional area, etc.). Additionally, mistakes in construction of the microfluidic device (e.g., mistakes in etching or milling) can possibly produce a blocked, misaligned, or mispatterned microelement.

One method currently used to check for such problems involves injecting dyes through the microfluidic device. However, with complex microfluidic element arrangements, it can be difficult to accurately assess each element in the microfluidic device.

A welcome addition to the art would be an easy, non-invasive way to test microfluidic devices containing one or more microfluidic elements and/or capillary elements to verify that the device is functioning properly prior to operation of the device for its intended use (e.g., to confirm that no bubbles exist, or that no microchannels are blocked, etc.). The present invention includes methods and devices that accomplish these objectives.

BRIEF SUMMARY OF THE INVENTION

The present invention provides methods, systems, and devices for testing and/or verifying the proper function of microfluidic elements in a microfluidic device. To test/verify the function and configuration of the microfluidic elements, known voltages and/or electric currents are set at at least two or more various fluidic openings in the microfluidic device. Resulting voltages and/or electric currents (or lack thereof) are then determined at fluidic openings located at the terminus of one or more microfluidic elements which are fluidly coupled to the two (or more) fluidic openings in which the voltage or current is set, and the measured voltage and/or electric current is then compared to target calculated values that are expected to be present at such fluidic openings based upon the configuration of the microfluidic elements.

In a first aspect of the invention, a method of verifying the proper function of a microfluidic device is disclosed, which device comprises at least first, second and third fluidic openings, which fluidic openings are fluidly coupled to at least first, second and third microscale channel elements, the method comprising flowing an electrically conductive buffer through the microscale channel elements; setting a known applied voltage potential between the first and second fluidic openings; setting a current in the third microscale element to be approximately zero; detecting a resulting voltage at the third fluidic opening; and, comparing the detected voltage at the third fluidic opening with a calculated target voltage expected at the third fluidic opening to determine whether there is a fault in at least one of the first and second microscale channel elements. The above testing regimen can be repeated one or more times at the other fluidic openings (e.g., the first and second fluidic openings) to determine whether there is a fault (e.g., air bubble) in any one of the first, second and third microscale channel elements. The above testing regimen can be used to test the function of more complex microscale devices that have greater than three fluidic openings and/or microscale channel elements.

In a related aspect of the invention, a method of verifying the proper function of a microfluidic device is disclosed, which device comprises at least first, second and third fluidic openings, which fluidic openings are fluidly coupled to first, second and third microscale channel elements, the method comprising: flowing an electrically conductive buffer through the microscale channel elements; setting a known applied voltage potential between the first and second fluidic openings; setting a known applied voltage at the third fluidic opening; detecting a resulting current at the third fluidic opening; and, comparing the detected current at the third fluidic opening with a calculated target electric current expected at the third fluidic opening to verify whether there is a fault in at least one of the first and second channel elements. Other embodiments exist wherein a known electric current is set between the first and second fluidic openings of the microfluidic device, and the resulting voltages are read at the third fluidic opening, as well as wherein known electric currents are set and the resulting electric currents are read at the third fluidic opening. The measured voltages and/or currents at the third fluidic opening are then compared to target calculated values expected at the third fluidic opening to determine whether both of the first and second microscale channel elements are properly functioning. The above testing regimen can be repeated one or more times at the other fluidic openings (e.g., the first and second fluidic openings) to determine whether there is a fault (e.g., air bubble) in any one of the first, second and third microscale channel elements.

In certain embodiments, the third fluidic opening comprises an opening in a capillary element which is fluidly coupled to the microscale element, wherein the step of testing voltage and/or electric current at the third fluidic opening comprises testing the voltage and/or current through such capillary element. Additionally, such capillary element may be fluidly coupled to one or more sources of fluidic material (optionally electrically conductive fluidic material) which is optionally external to the microfluidic device (for example, in a microwell plate).

In another aspect of the present invention, a system configured to verify a function of one or more microscale elements in a microfluidic device is disclosed, the system comprising: a microfluidic device comprising a body structure having one or more microscale channel elements fabricated therein, which one or more microscale channel elements is fluidly coupled to at least first, second and third fluidic openings and which terminates at one end at the third fluidic opening; a first, second and third electrode electrically connected to respectively the first, second and third fluidic openings of the microfluidic device; at least one source of at least one electrically conductive buffer, fluidly coupled to the one or more microscale channel elements; a fluid direction system which controllably moves the electrically conductive buffer through the one or more microscale channel elements; an electrical controller which is electrically coupled to at least the first and second electrodes, wherein the electrical controller is operable to control a level of voltage or current applied to at least the first and second electrodes; a detector which is operable to detect voltage or current at at least the third electrode in the third fluidic opening; and, system software comprising logical instructions which verify the function of the one or more microscale elements based upon information received from the detector. The fluid direction system may comprise one or more of: electroosmotic flow, electrophoretic flow, pressure based flow, wicking, and/or hydrostatic pressure based flow systems.

Many additional aspects of the invention will be apparent upon complete, review of this disclosure, including uses of the devices and systems of the invention, methods of manufacture of the devices and systems of the invention, kits for practicing the methods of the invention and the like. For example, kits comprising any of the devices or systems set forth above, or elements thereof, in conjunction with, e.g., packaging materials (e.g., containers, sealable plastic bags, etc.) and instructions for using the devices to practice the methods herein, are also contemplated.

BRIEF DESCRIPTION OF THE DRAWINGS

FIGS. 9A–B are respective charts showing various voltages and electric currents applied to microfluidic devices having a channel layout configuration shown in FIGS. 6A–B, respectively, and showing the approximate target voltage and current expected at the various reservoirs or capillary element openings of the devices.

FIGS. 10A–B show test results which generally match expected target values for voltage and current, respectively, for a device as shown in FIG. 6A, and FIG. 10C illustrates a device as shown in FIG. 6B having one or more blocked or otherwise problematic microfluidic channels.

DETAILED DESCRIPTION

Figure 1:
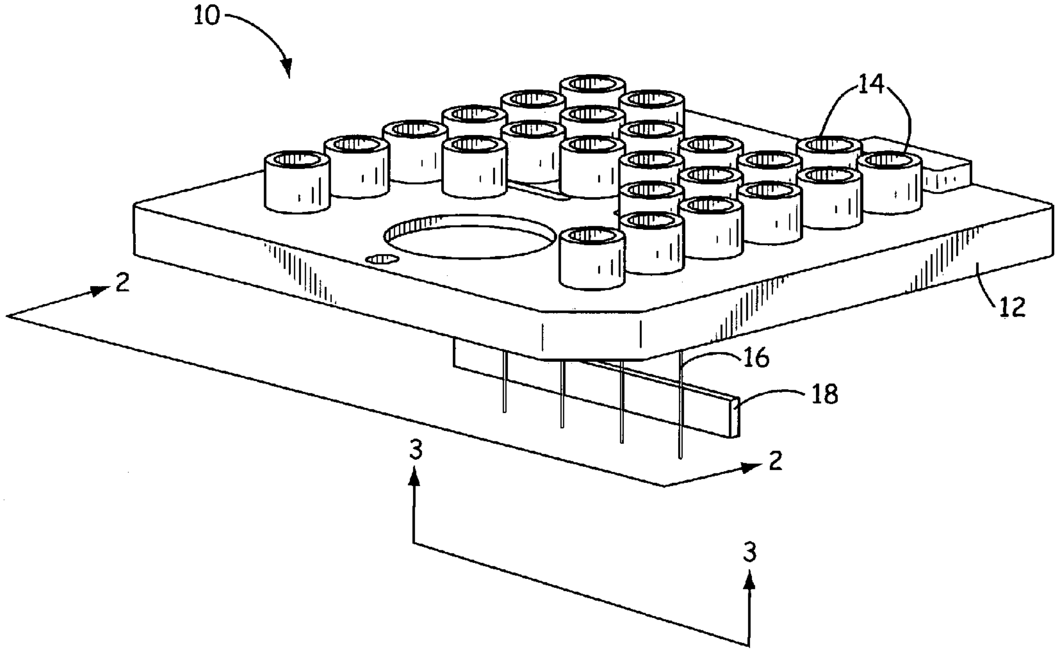
FIG. 1 is a perspective view of an exemplary microfluidic device which includes a plurality of capillary (sipper) elements which are aligned with respect to each other through the use of a V-groove guide.

The methods and devices of the invention directly address and solve concerns associated with testing the proper function of microfluidic channels and devices. Specifically, the invention provides methods for determining whether the various microfluidic channel or capillary elements in a microfluidic device are blocked (e.g., by incomplete etching of a microchannel, presence of an air bubble, etc.).

Briefly, the methods and devices of the current invention involve the testing of microfluidic devices in order to detect bubbles trapped within the microfluidic channels and/or blocked elements, misplaced patterns of elements, etc. As explained in more detail below, devices herein set known voltages and/or currents at two or more various fluidic openings (e.g., open wells or reservoirs at the ends of microchannels, fluidic openings at the ends of capillary elements, etc.) of microfluidic devices. The resulting voltages/currents measured at a third fluidic opening which is fluidly coupled to the two (or more) fluidic openings at which the voltage or current is set, gives an indication of the state (e.g., blocked, unblocked, partially blocked, etc.) of the various microfluidic channel elements across which the voltage or electric current was transmitted. Expected voltage and expected current can be calculated for the fluidic opening of the microfluidic elements (based upon, e.g., resistance in the elements, buffer used, etc.) and compared against the actual readings received.

The present invention also optionally includes various elements involved in, e.g., monitoring the testing of microfluidic channel elements and microfluidic devices, such as, temperature control of various fluidic materials/buffers, fluid transport mechanisms (e.g., to move electrically conductive fluidic material into, through, or to, the microfluidic channel elements to be tested by the methods of the current invention), and robotic devices for, e.g., positioning of components or devices involved.

I. Methods and Devices of the Invention

A. Microfluidic Devices to be Tested/Verified

The methods and devices of the present invention are preferably used to test for the proper function of microfluidic channel elements in a microfluidic device. As used herein, the term "microfluidic," or the term "microscale" when used to describe a fluidic element, such as a passage, chamber or conduit, generally refers to one or more fluid passages, chambers or conduits which have at least one internal cross-sectional dimension, e.g., depth or width, of between about 0.1 microns and 500 microns. In the devices of the present invention, the microscale channels preferably have at least one cross-sectional dimension between about 0.1 micron and 200 microns, more preferably between about 0.1 micron and 100 microns, and often between about 0.1 micron and 20 microns. Accordingly, the microfluidic devices or systems of the present invention typically include at least one microscale channel, and preferably at least two or more intersecting microscale channels disposed within a single body structure. FIGS. 1–6 give a few non-limiting examples of the diverse arrangements of microfluidic channel configurations that can be tested by the current invention. In general, myriad different microscale systems, devices, and elements are optionally tested/verified through use of the methods and devices of the present invention.

The body structure of the microfluidic device may comprise a single component, or an aggregation of separate parts, e.g., capillaries, joints, chambers, layers, etc., which when appropriately mated or joined together, form the microfluidic device of the invention, e.g., containing the channels and/or chambers described herein. Typically, the microfluidic devices described herein will comprise a top portion, a bottom portion, and an interior portion, wherein the interior portion substantially defines the channels and chambers of the device. In preferred aspects, the bottom portion will comprise a solid substrate that is substantially planar in structure, and which has at least one substantially flat upper surface. A variety of substrate materials may be employed as the bottom portion. Typically, because the devices are microfabricated, substrate materials will generally be selected based upon their compatibility with known microfabrication techniques, e.g., photolithography, wet chemical etching, laser ablation, air abrasion techniques, injection molding, embossing, and other techniques. The substrate materials are also generally selected for their compatibility with the full range of conditions to which the microfluidic devices may be exposed, including extremes of pH, temperature, salt concentration, and application of electric fields. Accordingly, in some preferred aspects, the substrate material may include materials normally associated with the semiconductor industry in which such microfabrication techniques are regularly employed, including, e.g., silica based substrates such as glass, quartz, silicon or polysilicon, as well as other substrate materials, such as gallium arsenide and the like. In the case of semiconductive materials, it will often be desirable to provide an insulating coating or layer, e.g., silicon oxide, over the substrate material, particularly where electric fields are to be applied.

In additional preferred aspects, the substrate materials will comprise polymeric materials, e.g., plastics, such as polymethylmethacrylate (PMMA), polycarbonate, polytetrafluoroethylene (TEFLON™), polyvinylchloride (PVC), polydimethylsiloxane (PDMS), polysulfone, and the like. Such substrates are readily manufactured from microfabricated masters, using well known molding techniques, such as injection molding, embossing or stamping, or by polymerizing the polymeric precursor material within or against the mold or master. Such polymeric substrate materials are preferred for their ease of manufacture, low cost and disposability, as well as their general inertness to most extreme reaction conditions. Again, these polymeric materials may include treated surfaces, e.g., derivatized or coated surfaces, to enhance their utility in the microfluidic system, e.g., provide enhanced fluid direction, e.g., as described in U.S. Pat. No. 5,885,470, and which is incorporated herein by reference in its entirety for all purposes.

The channels and/or chambers of the microfluidic devices are typically fabricated into the upper surface of the substrate, or bottom portion, using the above described microfabrication techniques, as microscale grooves or indentations. The lower surface of the top portion of the microfluidic device, which top portion typically comprises a second planar substrate, is then overlaid upon and bonded to the surface of the bottom substrate, sealing the channels and/or chambers (the interior portion) of the device at the interface of these two components. Bonding of the top portion to the bottom portion may be carried out using a variety of known methods, depending upon the nature of the substrate material. For example, in the case of glass substrates, thermal bonding techniques may be used which employ elevated temperatures and pressure to bond the top portion of the device to the bottom portion. Polymeric substrates may be bonded using similar techniques, except that the temperatures used are generally lower to prevent excessive melting of the substrate material. Alternative methods may also be used to bond polymeric parts of the device together, including acoustic welding techniques, or the use of adhesives, e.g., UV curable adhesives, and the like. The various methods of microfluidic device construction may result in small levels of defects in construction of the various microfluidic elements, due, for example to misalignment of substrate layers, etc. The electrodes, or similar electrical conduits of the invention, are optionally in electrical contact with fluidic openings in the substrates of the microfluidic device. Additionally, in the completed microfluidic device, such openings can function as reservoirs for allowing fluid and/or material introduction into the microfluidic elements or the interior areas of the microfluidic device.

In order to manipulate materials within the microfluidic devices described herein, such as the electrically conductive buffer which is used for the testing operation, the overall microfluidic systems of the present invention typically include a material direction system to manipulate selected materials within the various channels and/or chambers of the microfluidic device. By "material direction system" is meant a system which controls the movement and direction of fluids containing such materials within intersecting channel structures of a microfluidic device. Generally, such material direction systems employ pumps or pressure systems, and valves to affect fluid movement and direction in intersecting channels. A large number of microfabricated mechanical pumps and valves have been previously described in the art. Although such fluid direction elements may be useful in many aspects of the present invention, by and large, these elements are not preferred due to the complexity and cost of their manufacture. Further, the limits of microfabrication technology with respect to such pumps and valves, do not readily permit the manufacture of such elements that are capable of precisely handling sufficiently small volumes, e.g., volumes less than 1 micron. Thus, in particularly preferred aspects, the microfluidic systems of the present invention employ electroosmotic material direction systems to affect direction and transport of fluid borne materials within the microfluidic devices and systems of the invention. “Electroosmotic material direction systems,” as used herein, refer to material direction systems which employ controlled electroosmotic flow to affect fluid movement and direction in intersecting channel structures. In particular, such systems function by applying a voltage gradient across the length of a fluid filled channel, the surface or walls of which have charged or ionizeable functional groups associated therewith, to produce electroosmotic flow of that fluid within that channel. Further, by concurrently regulating flow in two or more channels that meet at an intersection, one can direct fluid flow at that intersection. Such electroosmotic material direction systems and controllers are described in detail in, e.g., Published PCT Application No. 96/04547 to Ramsey et al., and U.S. Pat. Nos. 5,779,868 and 6,399,023, each of which is incorporated herein by reference in its entirety for all purposes.

As mentioned previously, many microfluidic devices incorporate capillary elements (or other similar pipettor elements) such as sippers or electropipettors into their design. The typical structure of one example of such a capillary element is illustrated in U.S. Pat. No. 5,779,868, issued Jul. 14, 1998, entitled “Electropipettor and Compensation Means for Electrophoretic Bias,” issued to J. Wallace Parce et al. which is incorporated herein by reference in its entirety for all purposes: Microfluidic devices can include multiple capillary elements (e.g., 1, 2, 3, 4, 6, 8, 10, 12, 15, 20 or more elements) extending from the body of the microfluidic device, e.g., for simultaneous and/or parallel access to samples or fluidic reagents. For example, and with reference to FIGS. 1–4, a microfluidic device 10 is shown which includes a body structure 12 including a plurality of reservoirs 14 which fluidly communicate with microchannels (not shown) located within the device. The microfluidic device 10 of FIG. 1 includes a plurality of capillary elements or sippers 16 which extend from the body structure 12 and which are fluidly coupled to the microchannels. Although only four sippers are shown in FIGS. 1–4, the device can include more (or less) sippers depending on the throughput requirements of the system. For example, a 12-sipper microfluidic device is disclosed in U.S. Pat. No. 5,942,443, which has been previously incorporated by reference herein.

Figure 2:
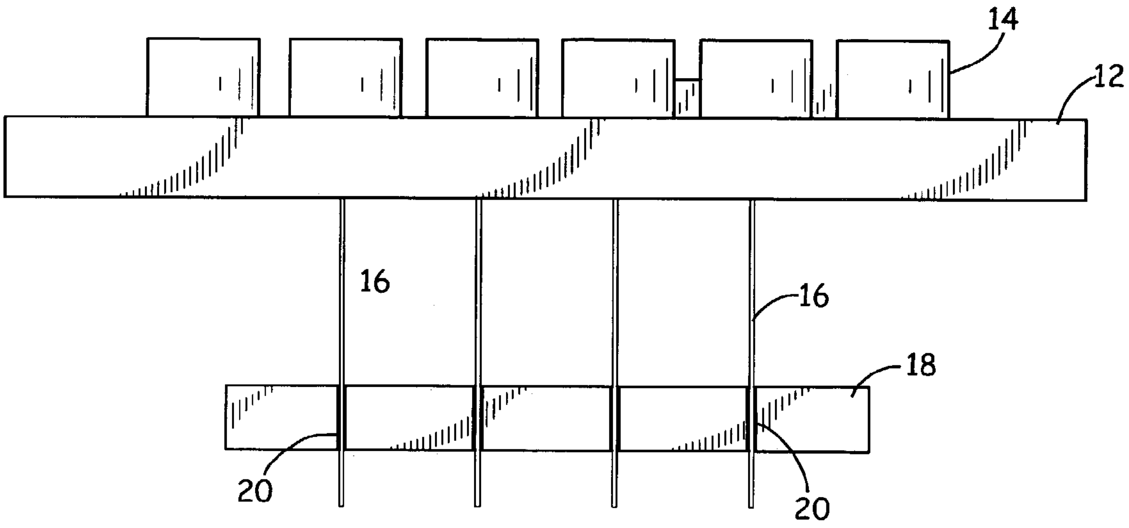
FIG. 2 is a side view of the microfluidic device of FIG. 1 taken along the line 2—2 of FIG. 1.
Figure 4:
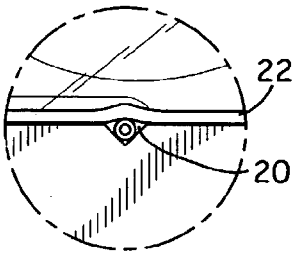
FIG. 4 is an exploded view of a portion of the V-groove guide of the microfluidic device of FIG. 1 taken along the dashed circular line of FIG. 3.

As shown in FIG. 1, and as best seen in FIGS. 2 and 4, a guide 18 for aligning the sippers with respect to each other is also preferably provided. In particular, when the microfluidic device of FIG. 1 is used to draw or sip samples from an external source, e.g., a microwell plate (e.g., 96-well, 384-well or 1536-well plates) or a solid substrate which includes a plurality of samples which are reversibly immobilized on the support, e.g., a LibraryCard™ reagent array as is disclosed, for example, in U.S. Pat. No. 6,042,709, the entire contents of which are incorporated by reference herein, the alignment of the sippers (capillaries) with respect to each other needs to meet tight tolerances on the order of about 50 μm or less. This is necessary so that all the sippers simultaneously visit multiple individual samples or compound spots on the solid support and draw up substantially equivalent amounts of sample. Misalignment of any one or more of the sippers with respect to the other sippers may cause the sippers to not contact one or more sample or compound spots on the substrate correctly, and hence data quality may be compromised.

Figure 3:
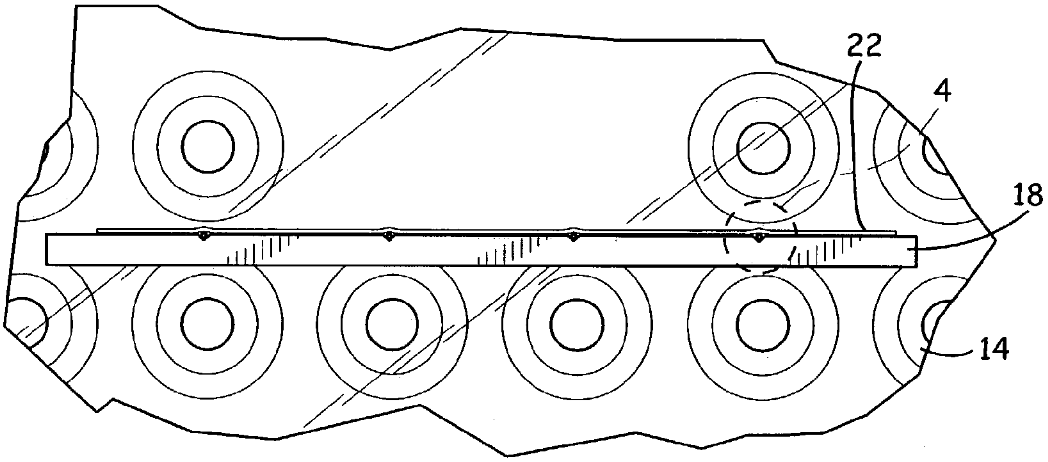
FIG. 3 is bottom view of a portion of the microfluidic device of FIG. 1 taken along the line 3—3 of FIG. 1.

The provision of the guide 18 thus helps to align the sippers with respect to each other. The guide 18 includes a plurality of V-shaped grooves 20 corresponding to the number of sippers extending from the microfluidic device (in this case, the guide includes four V-shaped grooves corresponding to the four sippers extending from the body structure of the microfluidic device 10). The spacing of the V-grooves 20 is dictated by the spacing between the respective sippers 18 of microfluidic device 10. The V-groove configuration aids the sippers in nesting in the groove which provides for precise alignment of the sippers with respect to each other. The guide 18 preferably is made from a crystal material such as silicon to allow one to precisely form (e.g., etch) the V-groove surfaces, although it can be made from other materials as well such as glass, polymers, and the like. For example, a silicon block with a major surface in the (100) crystallographic plane will be etched anisotropically to form grooves with surfaces lying in the (111) planes. Therefore, the angle of the two sloping walls of a groove will always be precisely determined by the orientation of the crystal planes with respect to the major surface regardless of the time of etching the major surface. It will be appreciated that although the grooves are shown in a V-shaped configuration, the grooves could also be etched with a planar bottom and similar sloping sidewalls. The sippers 16 are positioned within the V-shaped grooves 18 and glued into place with a suitable adhesive. Alternatively, as shown in FIGS. 3 and 4, a layer of a suitable tape 22 can be placed over the sippers once positioned in the grooves to firmly hold them in place against the side walls of the groove. FIG. 4 is an enlarged view of one of the V-grooves 20 taken along the dashed line 4 in FIG. 3. As shown in the Figure, the sipper 16 is supported on the side faces of the groove which thus locates the position of the sipper in two orthogonal directions, i.e., vertically and horizontally, so that each sipper is precisely aligned with the guide 18. The guide 18 is preferably positioned at an intermediate position along the length of the sippers as best seen in FIG. 2 to allow sufficient space for the distal ends of the sippers to make contact with sample materials in the wells of multiwell plates and/or compound spots on a solid substrate such as a LibraryCard substrate described previously. The guide 18 is also spaced an appropriate distance below the lower surface of the device 10 (where the sippers are coupled to the device (e.g., by a suitable adhesive)) to avoid contact of the guide 18 with the adhesive holding the sippers in place.

The incorporation of capillary elements in microfluidic devices can present problems of bubble formation in the filling of the microfluidic elements (e.g., microchannels) of the device. During the production and before their use, microfluidic elements (such as microchannels) and microfluidic devices are typically wetted and filled with a fluid such as a buffer. Bubbles of air can often be trapped in the interface between a capillary element and the substrate layers of a microfluidic device during this wetting and filling. Of course, possibilities of bubble formation/trapping can also arise in microfluidic devices without capillary elements. In either case, such bubbles and other possible malfunction of microfluidic elements can be detected through the testing methods of the current invention.

Figure 5A:
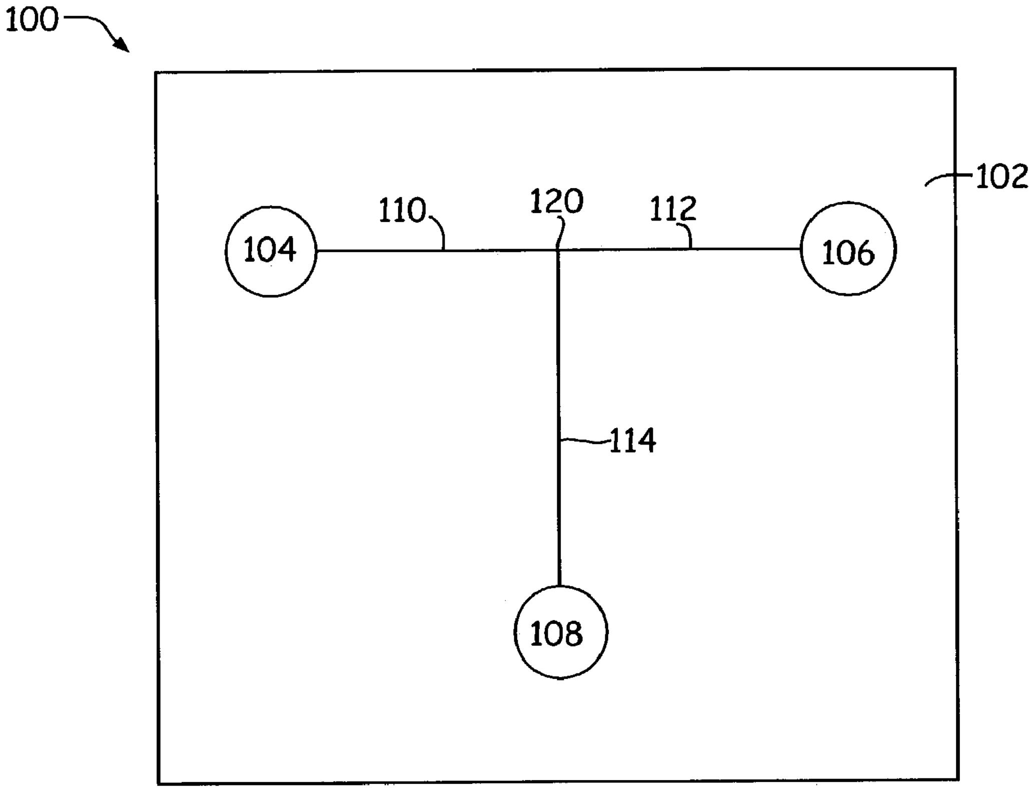
FIG. 5A is a schematic illustration of a simple microfluidic device channel "T" configuration having three microchannel elements which are fluidly coupled to three separate fluidic openings.

FIG. 5A illustrates an example of a simple microfluidic device channel configuration which can be used to illustrate the teachings of the testing methods of the current invention. As shown, the overall device 100 is fabricated from two planar substrate layers 102 and 103 (not shown). Optionally, the device may also include one or more sampling element or capillary (not shown) that is attached to the finished structure as described above with reference to FIGS. 1–4. In fabricating the device shown, a network of channel elements or grooves 110, 112, 114 is fabricated into the surface of substrate 102. The grooves can be fabricated into a variety of different configurations or network geometries depending upon the type of operation to which the device is to be put. As shown, each groove terminates in an aperture or port disposed through substrate 102, e.g., ports 104, 106 and 108 respectively. When substrates 102 and 103 are mated together and bonded, the groove network is sealed to define an enclosed channel network. The ports 104, 106 and 108 are sealed on one side to define fluid reservoirs and access points for fluids, electrodes, and the like to the channel network.

As shown in the example microfluidic device in FIG. 5A, blockages possibly occur in, e.g., main channel 114 (or within a side channel leading to a well such as 110 or 112). Additionally, bubbles can possibly be trapped where main channel 114 or side channels 110, 112 interface with a capillary element (not shown) which interfaces with the substrate of the microfluidic device at one of the termini of the channels. Furthermore, other construction problems, e.g., misalignment of a channel can arise. For example, the microchannel connecting well 108 and main channel 114 could have an unintended bow or distension in the channel, thus causing the channel path to be longer than intended or appropriate for its intended use. Additionally, some microchannels are constructed so as to vary in width and/or depth at specific regions along their length, thus changing their cross sectional geometry. Again, due to defects in construction and/or blockages, such intended variations can be unintentionally eliminated or of the wrong proportions. The methods and devices of the current invention, as more fully explained in the examples below, allow detection of such above described problems. Microfluidic devices with defects can thus easily be discarded before valuable time and/or reagents are wasted upon them.

The arrangement of channels depicted in FIG. 5A is only one possible arrangement out of many which are appropriate and available to be tested using the methods and devices of the present invention. Additional alternatives can be readily devised, e.g., by combining microfluidic elements such as flow reduction channels, with other microfluidic devices in the patents and applications referenced herein. Also, optional configurations can include, e.g., a variable number of capillary elements integrated into the microfluidic device, multiple reaction areas, mixing channels, etc. Such optional configurations incorporating diverse elements can also optionally be tested with the methods and devices of the invention. Furthermore, the microfluidic devices which are capable of being tested through use of the invention typically include at least one main analysis channel, but may include two or more main analysis channels in order to multiplex the number of analyses being carried out in the microfluidic device at any given time. Typically, a single microfluidic device will include from about 1 to about 100 or more separate analysis channels. In most cases, the analysis channel is intersected by at least one other microscale channel disposed within the body of the device. Typically, the one or more additional channels are used, e.g., to bring the samples, test compounds, assays reagents, etc. into the main analysis channel, in order to carry out the desired analysis. Additionally, the width of the microfluidic channels can optionally be wider in some microfluidic devices than in other microfluidic devices depending upon the desired use of the device. All of such microfluidic devices are capable of being tested through use of the methods and devices of the present invention.

II. Examples of Uses of the Methods and Devices of the Invention

In testing the microfluidic channel elements 110, 112, and 114 in the device shown in FIG. 5A, for example, the channels are filled with an electrically conductive buffer solution, whether prior to being tested or during the testing procedure. The source of electrically conductive buffer may be integrated with the body structure, e.g., as one or more reservoirs or wells 104, 106, or 108 disposed in the body structure and in fluid communication with the other channel elements. Alternatively, the source of buffer solution may be external to the body structure, e.g., a test tube, or well in a multiwell plate, which is placed into fluid communication with one of the channel elements 110, 112, and/or 114 via a sampling pipettor or capillary element (not shown) which is itself connected to or a part of one of the channel elements. The buffer solution is then transported from the various reservoirs into the sample channel elements using appropriate fluid direction schemes, such as pressure-based flow, electroosmotic flow, a combination of the two, or other various fluid direction schemes.

Figure 5B:
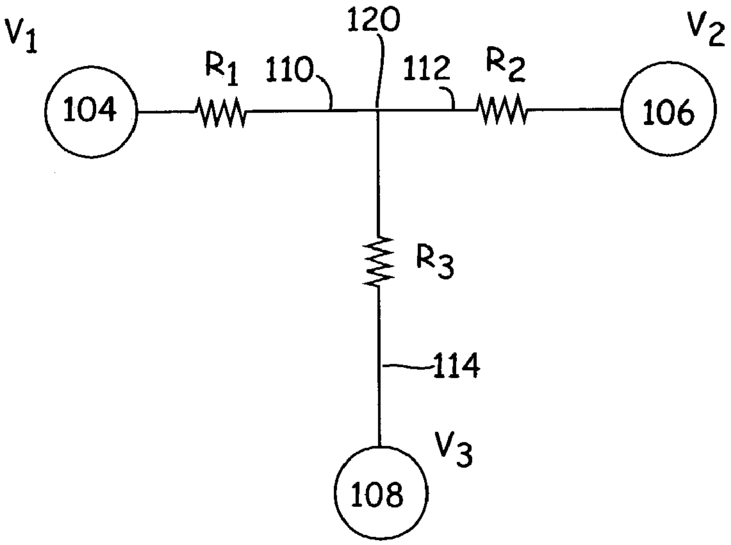
FIG. 5B is a diagram representing an electrical circuit corresponding to the microfluidic device in FIG. 5A.

The networks of fluid filled microfluidic channel elements in the device of FIG. 5A can be represented as a network of electrical resistances, i.e., each network can be reduced/represented as an electric circuit. For example, FIG. 5B shows the corresponding electric circuit diagram representations for the microfluidic element networks of the devices shown in FIG. 5A. For example, R1, R2 and R3 represent the electrical resistances of the channel elements 110, 112, and 114, respectively. In the circuit shown in FIG. 5B, a linear relationship between voltage and current (Ohm's Law) is assumed.

The buffer solution flowed through the microfluidic devices herein is electrically conductive. Electrophoretic migration of ions (i.e., in the fluidic material) is obtained by the flow of electrical forces along the axis of an electric field gradient. The resulting electrophoretic migration shows itself macroscopically as a conduction of electric current in the solution under the influence of an applied voltage and follows Ohm's law, V=(R)(I), wherein V=voltage, R=resistance, and I=electric current. The resistance, R, is proportional to the reciprocal of conductance, L, and is also related to the electrophoretic mobility or conductivity. Thus, the resistance of specific microfluidic channel elements (e.g., R1, R2, and R3 corresponding to the flow resistance in channel elements 110, 112, and 114, respectively) can be calculated for various microfluidic devices since known voltages and/or electric currents are flowed through the microfluidic elements. Because of the inter-relatedness of voltage, current and resistance through the microelements, the results of the testing of the microfluidic devices by the present invention can be expressed, or thought of, in terms of measurement of resistance through microfluidic elements or voltage and/or electric current at fluidic openings.

For any specific chip design (such as that shown in FIG. 5A, for example), the value of electrical resistance in any channel of the electrical network can be calculated if the channel geometry and the conductivity of the buffer are known. Consequently, the voltage or current distribution can be obtained by using Ohm's law or from standard commercially available electrical network analysis software packages such as SPICE. Circuit testing or electrical network analysis is well known in the electronic industry to one of ordinary skill in the art. There are many different approaches to perform a test for an electronic circuit. The same analogy can be applied to the electronic testing of microfluidic devices.

A particularly useful approach is to first set a known applied voltage potential (V1, V2) between the fluidic openings 104 and 106 and then to measure the voltage of a node point (e.g., node point 120 at the intersection of microfluidic channel elements 110 and 112) by controlling the external voltage on the reservoir 108 fluidly coupled to channel 114 so that the current flow through the channel 114 is zero. For example, with reference to FIG. 5B, to measure the node voltage between representative channel resistances R1 and R2 in FIG. 5A, one can adjust the voltage V3 at reservoir 108 such that the current in R3 is zero. This applied voltage V3 is then equivalent to the voltage at the node point 120 between R1 and R2. One can then detect a resulting voltage at the fluidic opening 108, and then compare the detected voltage at the fluidic opening 108 with a calculated target voltage (based on Ohm's law) expected at the fluidic opening 108 to determine whether there is a fault (e.g., blockage such as an air bubble) in one of the microscale channel elements 110 and 112. This testing procedure can then be repeated two (or more) times by applying a known voltage potential between two different other fluidic openings (e.g., openings 106 and 108), and then measuring a voltage and/or current at the remaining fluidic opening (e.g., 104) to determine whether there is a fault in one of the other channel segments (e.g., channel elements 114 and 112). Thus, one can apply a known voltage potential between any two fluidic openings in a microfluidic device, and then measure a voltage and/or current at a third fluidic opening to determine whether there is a fault in discrete channel segments of the device, for example. This testing procedure can be performed for simple channel configurations as described above with reference to FIG. 5A, or with much more complex channel element arrangements as described below with reference to FIGS. 6A–B, for example.

Alternatively, the present testing method can be performed by testing for current (rather than voltage) at a fluidic opening in the device, e.g., by first setting a known applied voltage potential between fluidic openings, or reservoirs, 104 and 106, for example, and then applying a known applied voltage at fluidic opening 108. One can then detect a resulting current at fluidic opening 108, and compare the detected current with a calculated target electric current expected at the fluidic opening 108 to verify whether there is a fault in at least one of the channel elements 110 and 112. This testing procedure can be performed additional times for the other fluidic openings 104, 106 by setting a voltage potential between fluidic openings 106, 108 and 108, 104, respectively, and then applying a known applied voltage to fluidic opening 104 or 106, respectively, to measure the current at these fluidic openings as well to determine whether there is a fault in at least one of the channel elements 112, 114 and 114, 110, respectively.

Figure 6A:
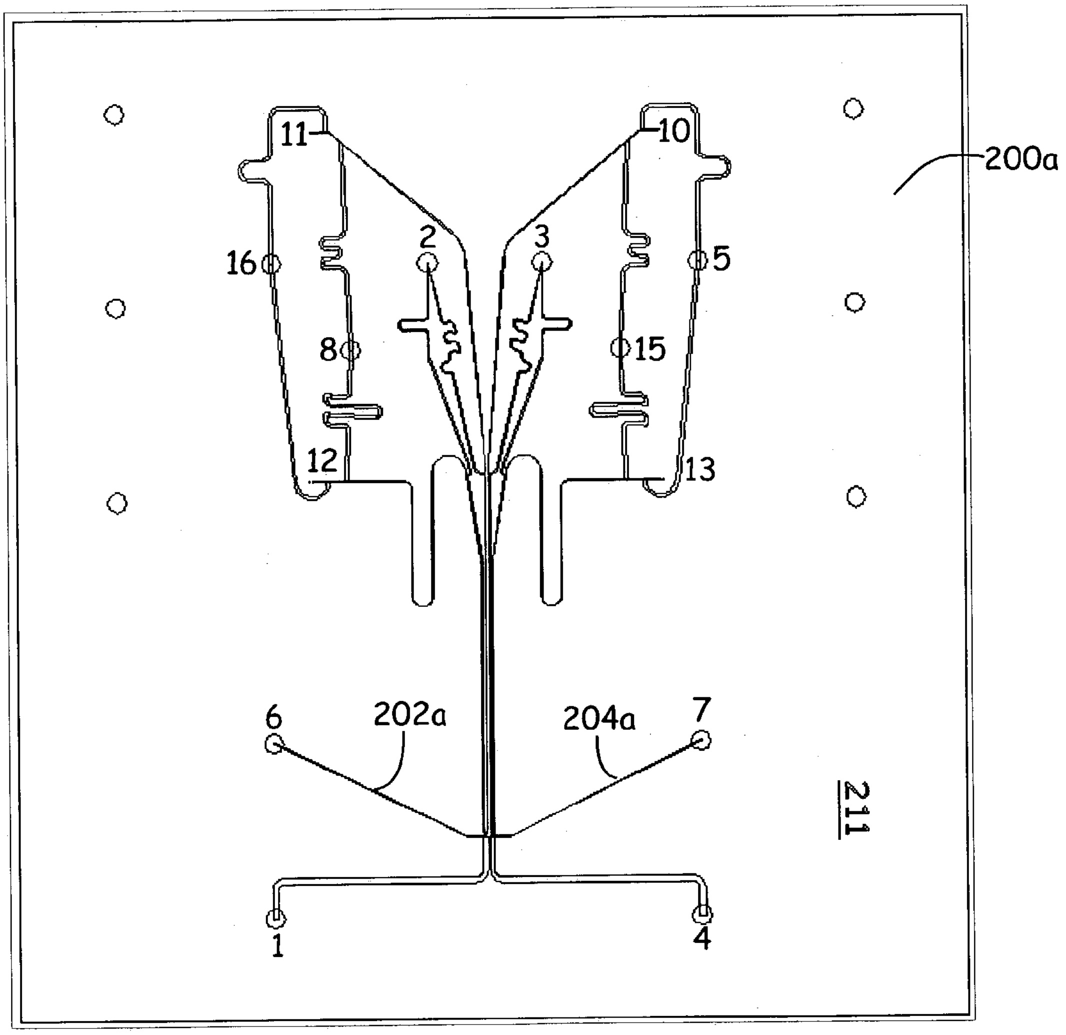
FIGS. 6A–B are specific examples of more 'complex' microfluidic devices tested/verified using the methods and devices of the invention.
Figure 6B:
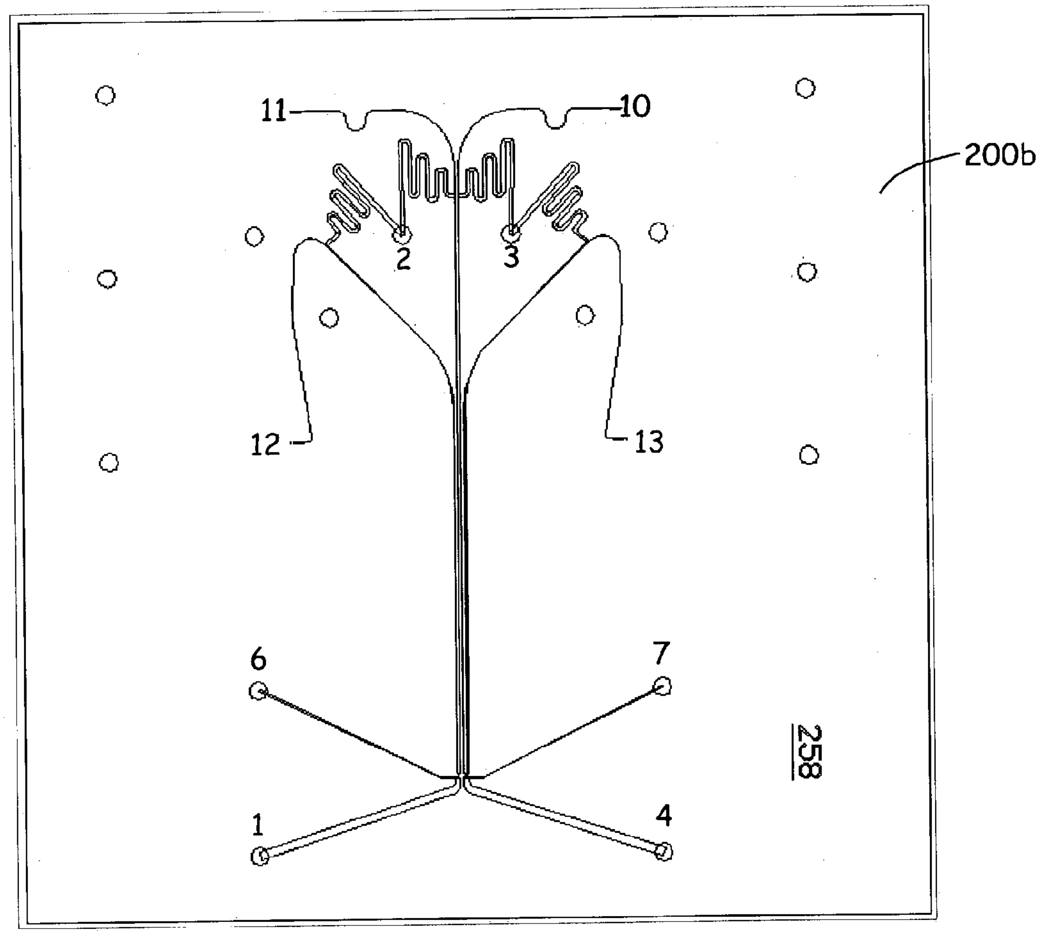

FIGS. 6A–B illustrate two possible configurations of the types of more complex microfluidic channel configurations capable of being tested by the methods of the present invention. It will be appreciated that the configurations shown in FIGS. 6A–B optionally can be greatly modified while staying within the scope of microfluidic devices capable of being tested with the methods and devices of the invention. As illustrated in FIGS. 6A–B, substrates 200*a* and 200*b* comprise microfluidic elements (e.g., microchannels, etc.) within the microfluidic devices. The two microfluidic devices illustrated in FIGS. 6A–B are each symmetrical around a central line and comprise two independent microchannel networks. For example, in the microelement arrangement in FIG. 6A, microchannel 202*a* (i.e., on the left side) is symmetric to microchannel 204*a* (i.e., on the right side). Of course, it will be appreciated that, through proper set-up, the methods and devices of the current invention are capable of testing/verifying nonsymmetrical microfluidic devices as well.

Figure 7A:
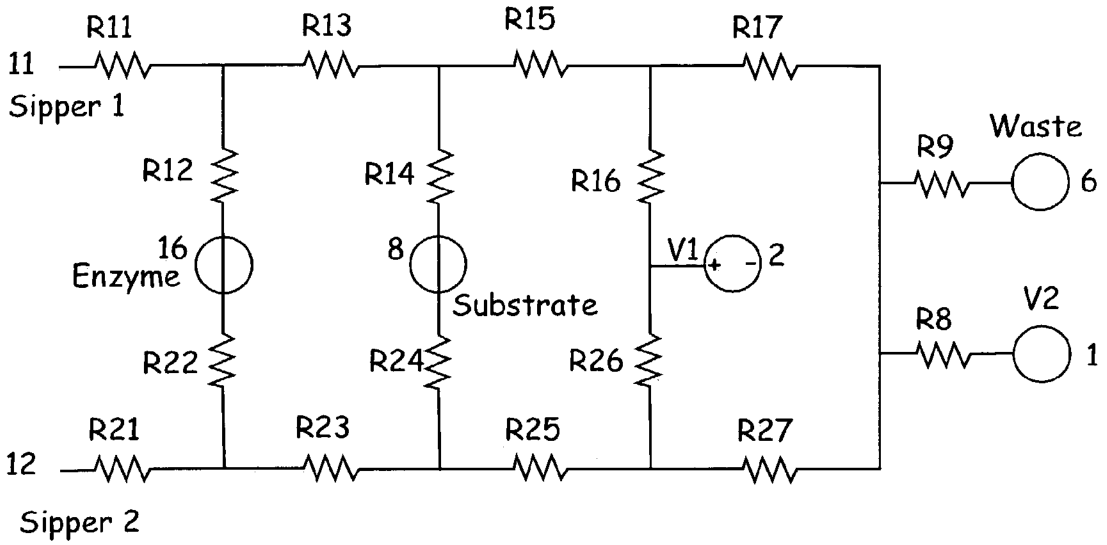
FIGS. 7A–B are diagrams representing electrical circuits corresponding to the microfluidic devices in FIGS. 6A–B, respectively.
Figure 7B:
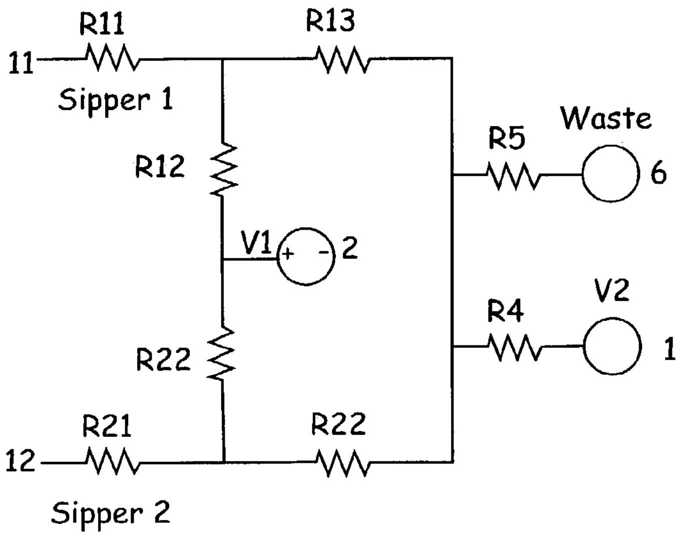

In testing the microfluidic elements in the devices shown in FIGS. 6A–B, as before, the channels are filled with an electrically conductive buffer solution, whether prior to being tested or during the testing procedure. The networks of fluid filled microfluidic elements in the devices of FIGS. 6A–B can be represented as a network of electrical resistances, i.e., each network can be represented as an electric circuit. For example, FIGS. 7A–B show the corresponding electric circuit diagram representations for the microfluidic element networks of the devices shown in FIGS. 6A–B, respectively. Because the microfluidic devices shown in FIGS. 6A–B are symmetrical, the electrical circuits representing such devices shown in FIGS. 7A–B only represent one-half of the devices for clarity and convenience. Thus, for example, FIGS. 7A and 7B are electronic circuit representations of the left side of each symmetrical microfluidic device shown in FIGS. 6A and 6B, respectively. In the circuits shown in FIGS. 7A–B, a linear relationship between voltage and current (Ohm's Law) is assumed. To measure the node voltage between representative channel resistances, e.g., R15 and R17 in FIG. 7A, one can adjust the voltage V1 at reservoir 2 such that the current in R16 is zero. This applied voltage V1 is then equivalent to the voltage at the node point between R15 and R17. Such testing can be repeated for the various other fluidic openings in the devices of FIGS. 6A–B to determine whether there is a problem with any one or more microfluidic channel elements.

Figure 8:
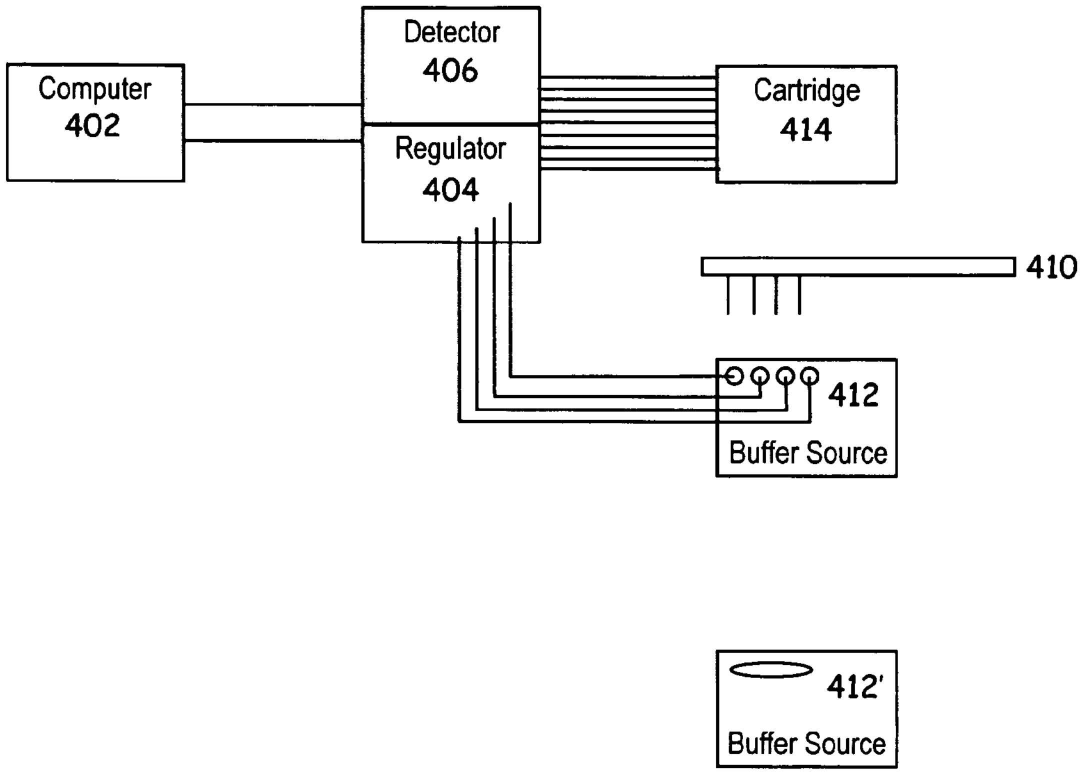
FIG. 8 is a schematic diagram of one embodiment of a voltage/current test system constructed in accordance with the principles of the present invention.

Examples of the microfluidic devices in FIGS. 6A–B were tested through use of the methods of the current invention. FIG. 8 is one embodiment of a voltage/current testing system constructed in accordance with the principles of the present invention. In FIG. 8, computer 402 controls and directs electrical regulator 404, which, in turn, is connected via electrodes to a cartridge 414 which holds microfluidic device 410. The electrodes extending from regulator 404 to cartridge 414 are electrically connected to fluidic openings (e.g., reservoirs or ports) in microfluidic device 410. The microfluidic device is optionally held within a holder or jig (not shown) to ensure proper placement and stability. Regulator 404 also is optionally connected via separate electrodes to an outside electrically conductive buffer source 412. The outside buffer source optionally comprises a microwell plate wherein each different electrode from regulator 404 to buffer source 412 is connected to a different well in the plate, or optionally can comprise a continuous fluid-filled trough 412' with a common electrode attached to all sippers or capillary elements extending from the device 410. The microfluidic device being tested 410 would then be fluidly connected to outside buffer source 412 or 412' through capillary elements extending from the microfluidic device.

The system shown in FIG. 8 can also optionally include a detector system 406 which is optionally attached to computer 402. The detector system detects the various resulting voltages and/or electric currents in the microfluidic elements being tested. In some embodiments, such aspect of detector 406 is performed through regulator 404. The computer 402 optionally includes appropriate software for receiving user instructions, either in the form of user input into set parameter fields, e.g., in a GUI, or in the form of preprogrammed instructions, e.g., preprogrammed for a variety of different specific operations (e.g., testing the various microfluidic elements in a microfluidic device). The software then converts these instructions to appropriate language for instructing the application of specific electric voltages or currents to microfluidic elements in microfluidic device 410.

The computer also optionally receives data from the one or more sensors/detectors included within the system (e.g., located at various fluidic openings in the microfluidic device), interprets the data, and either provides it in a user understood format, or uses that data to initiate further controller instructions, in accordance with the programming, such as applying voltages and electric currents over specific time periods, through different microelements, and the like. In some embodiments, the electric regulator functions as a sensor/detector.

In the present invention, the computer typically includes software for the monitoring and control of materials in the various aspects of the device. For example, the software directs flow switching to control and direct fluid flow as described above. Additionally, as described above, the software is optionally used to control the specific voltages and electric currents applied and to interpret the data received from the testing.

In addition, the computer optionally includes software for deconvolution of the signal or signals from the detection system, for example. For example, the deconvolution distinguishes the presence and/or degree of blockages, etc. of specific microfluidic elements of microfluidic devices being tested with a device of the invention.

Any controller or computer optionally includes a monitor which is often a cathode ray tube ("CRT") display, a flat panel display (e.g., active matrix liquid crystal display, liquid crystal display), or the like. Data produced from the device, e.g., electric current or voltage through a specific microfluidic element, is optionally displayed in electronic form on the monitor. Additionally, the data gathered from the device can be outputted in printed form, e.g., as in FIGS. 10A–C. The data, whether in printed form or electronic form (e.g., as displayed on a monitor), can be in various or multiple formats, e.g., curves, histograms, numeric series, tables, graphs and the like.

Computer circuitry is often placed in a box which includes, e.g., numerous integrated circuit chips, such as a microprocessor, memory, interface circuits, etc. The box also optionally includes such things as a hard disk drive, a floppy disk drive, a high capacity removable drive such as a writeable CD-ROM, and other common peripheral elements. Inputting devices such as a keyboard or mouse optionally provide for input from a user and for user selection of sequences to be compared or otherwise manipulated in the relevant computer system.

The two microfluidic devices represented in FIGS. 6A–B were tested by placing samples of electrically conductive buffer in four separate containers (e.g., four different wells of a microtiter plate 412 in FIG. 8). In the present testing, 1 mM EDTA or 100 mM HEPES, pH 7.5 were used, but other buffers are equally useful. The buffer placed in the wells was the same as the buffer present within the microfluidic elements of the devices to be tested. Any water condensation on the microfluidic devices was removed and the devices were placed in a holder and securely mounted. The microfluidic devices were positioned so that the sippers coupled to the microfluidic devices were placed within the four buffer wells. The buffer wells were also equipped with four separate electrodes electrically coupled to regulator 404 in FIG. 8.

Voltage and/or electric current via the electrodes was controlled through use of a 1275 LabChip controller and an MSRecorder, both available commercially from Caliper Technologies Corp. (Mountain View, Calif.), which correspond to reference numerals 404 and 406, respectively in FIG. 8. Each electrode was independently controlled through the regulator 404 and the voltage potentials were relative to the regulator's ground potential. Each microfluidic element tested (e.g., each microchannel tested) was assigned a fixed voltage or a fixed current. The voltage/current assignments will depend upon the specific layout of the microfluidic elements and upon the specific objectives of the test/verification.

In the testing of the microfluidic devices in FIGS. 6A–B, it was assumed that the microfluidic elements followed a linear relation along their entire length of V=(R)(I). In testing the microfluidic devices, if a microfluidic element is clogged or blocked, then a closed circuit cannot form. The computer 402 and regulator 404 automatically drag the voltage at a fluidic opening to its maximum value (i.e., out of bound) when no closed circuit is made through that fluidic opening/microelement. Additionally, in testing the microfluidic device, it is desired that the output reading or response should achieve a steady-state value, thus confirming that the microfluidic element is independent of any time-dependent process such as fluid mixing, bubble break-up or movement, or crack/leakage in the device. It is also desired that the voltage and electric current values be identical with respect to the plane of symmetry (if one exists), thus ensuring that all microfluidic elements are performing with top efficiency. The readings received from tested chips are typically compared against the values obtained from a model microfluidic device, thus, eliminating the possibility of any fine scale malfunctioning. Also, the various resistances in the microelements are calculated through applying required voltage/current combinations through the microelements.

FIGS. 9A–B show the various voltages and electric currents that were applied to the microfluidic devices in FIGS. 6A–B, respectively. The 16 electrodes in FIGS. 9A–B correspond to the 16 electrodes that were used in this particular configuration of the current invention. Many different numbers of electrodes, of course, are possible. The 16 electrodes in FIG. 9A correspond to the 16 fluidic openings (or ports or reservoirs) in the microfluidic device of FIG. 6A. In FIG. 9A, only 14 of the electrodes were tested, for convenience, in testing a chip having a channel layout configuration similar to that shown in FIG. 6A (e.g., a voltage and/or current was not applied to electrodes in reservoirs 9 and 14 of the chip in FIG. 6A), and FIG. 9B shows that only 10 electrodes were used in testing a chip having the channel layout configuration shown in FIG. 6B.

Figure 10A:
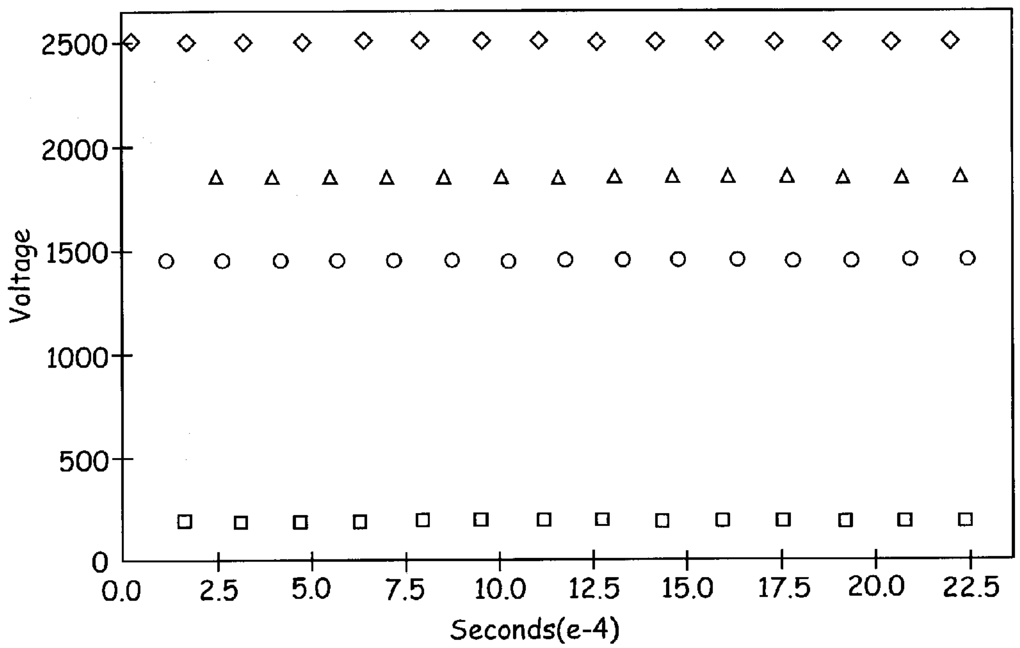
FIGS. 10A–C are graphical representations of test results from tests done on devices as shown in FIGS. 6A–B, where
Figure 10B:
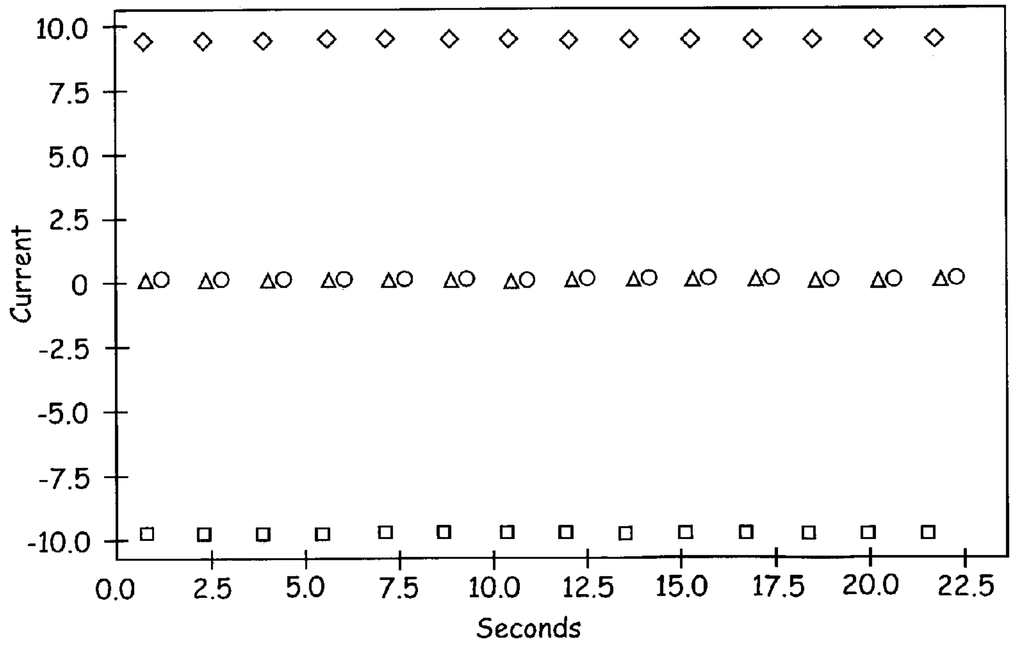

FIGS. 10A–B show plots of voltage versus time (FIG. 10A) and electric current versus time (FIG. 10B) for a properly functioning microfluidic device having a channel layout configuration as shown in FIG. 6A. As can be seen from the plots (which only shows voltage readings from two of the measured electrodes (e.g., electrodes 6 and 8) for ease of reference and convenience), the tested microfluidic device of FIGS. 10A and 10B can be considered fully efficient with no apparent blockages, leaks, etc. For example, the microfluidic device does not cause any out of bound readings and the readings are steady-state, thus, no apparent blockages or leakages exist.

Figure 10C:
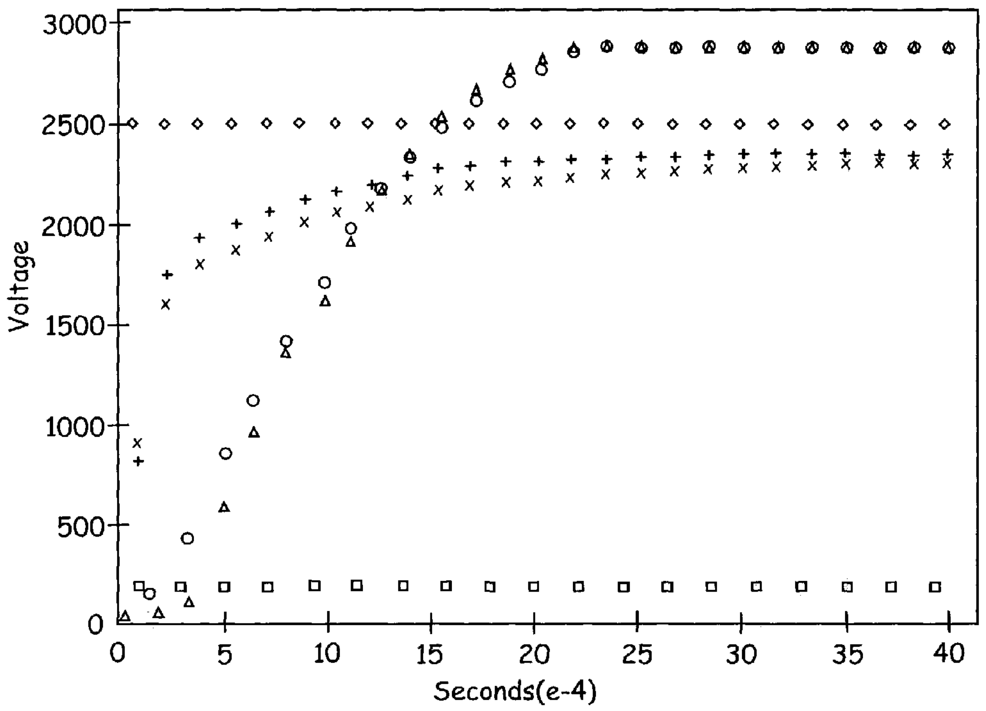

FIG. 10C, on the other hand, illustrates the voltage response of a malfunctioning microfluidic device of the kind having the channel layout configuration displayed in FIG. 6B. Here, the readings clearly indicate a malfunction of, or within, the microfluidic elements (e.g., sipper(s) and/or channel element(s) of the device) for which voltage readings were measured at the electrodes in the various wells of the device. For ease of convenience and reference, voltage measurements at only four of the 10 electrodes placed into the wells of the device of FIG. 6B are shown in FIG. 10C. The voltage readings at these four electrodes goes out of bounds (e.g., the measured voltages are not steady state and in some cases exceed the set-point target voltages at 200V and 2500V, respectively) indicating, e.g., a blockage by such thing as an air bubble, leak etc. in one or more microfluidic elements of the device. The presence of an air bubble blockage could be verified through refilling the microfluidic elements with fresh buffer (e.g., via pressure suction/injection). If such did not correct the readings, a permanent blockage (e.g., a construction defect) could be the cause.

The discussion above is generally applicable to the aspects and embodiments of the invention described herein. Moreover, modifications are optionally made to the methods and devices described herein without departing from the spirit and scope of the invention as claimed, and the invention is optionally put to a number of different uses.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, or other documents cited in this application are incorporated by reference in their entirety for all purposes to the same extent as if each individual publication, patent, patent application, or other document were individually indicated to be incorporated by reference for all purposes.

What is claimed is:

1. A method of verifying the proper function of a microfluidic device, which device comprises at least first, second and third fluidic openings, which fluidic openings are fluidly coupled to at least first, second and third microscale channel elements, respectively, the method comprising:

flowing an electrically conductive buffer through the first, second and third microscale channel elements;

setting a known applied voltage potential between the first and second fluidic openings;

setting a current in the third microscale channel element to be approximately zero;

detecting a resulting voltage at the third fluidic opening; and, comparing the detected voltage at the third fluidic opening with a calculated target voltage expected at the third fluidic opening to determine whether there is a fault in at least one of the first and second microscale channel elements.

2. A method of verifying the proper function of a microfluidic device, which device comprises at least first, second and third fluidic openings, which fluidic openings are fluidly coupled to at least first, second and third microscale channel elements, respectively, the method comprising:

flowing an electrically conductive buffer through the first, second and third microscale channel elements;

setting a known applied voltage potential between the first and second fluidic openings;

setting a known applied voltage at the third fluidic opening;

detecting a resulting current at the third fluidic opening; and, comparing the detected current at the third fluidic opening with a calculated target electric current expected at the third fluidic opening to determine whether there is a fault in at least one of the first and second microscale channel elements.

3. The method of claim 1 or 2, wherein the microfluidic device comprises two or more microscale channel elements each of which is fluidly coupled to at least three fluidic openings.

4. The method of claim 1 or 2 wherein at least said third fluidic opening comprises an opening in a capillary element which is fluidly connected to the third microscale channel element.

5. The method of claim 4, wherein said in the capillary element is fluidly connected to at least one source of fluidic material, said at least one source of fluidic material being external to the microfluidic device.

6. The method of claim 5, wherein the at least one source of fluidic material comprises a well in a microwell plate.

7. The method of claim 1 further comprising:

setting a known applied voltage potential between the second and third fluidic openings;

setting a known in the first microscale channel element to be approximately zero;

detecting a resulting voltage at the first fluidic opening; and, comparing the detected voltage at the first fluidic opening with a calculated target voltage expected at the first fluidic opening to determine whether the is a fault in at least one of the second and third microscale channel elements.

8. The method of claim 1 further comprising:

setting a known applied voltage potential between the first and third fluidic openings;

setting a current in the second microscale channel element to be approximately zero;

detecting a resulting voltage at the second fluidic opening; and, comparing the detected voltage at the second fluidic opening with a calculated target voltage expected at the second fluidic opening to determine whether there is a fault in at least one of the first and third microscale channel elements.

9. The method of claim 2 further comprising:

setting a known applied voltage potential between the second and third fluidic openings;

setting a known applied voltage at the first fluidic openings;

detecting a resulting current at the first fluidic opening; and, comparing the detected current at the first fluidic opening with a calculated target electric current expected at the first fluidic opening to determine whether there is a fault in at least one of the second and third microscale channel elements.

10. The method of claim 2 further comprising:

setting a known applied voltage potential between the first and third fluidic openings;

setting a known applied voltage at the second fluidic opening;

detecting a resulting current at the second fluidic opening; and, comparing the detected current at the second fluidic opening with a calculated target electric current expected at the second fluidic opening to determine whether there is a fault in at least one of the first and id microscale channel elements.

11. A system configured to verify a function of one or more microscale elements in a microfluidic device, the system comprising:

a microfluidic device comprising a body structure having one or more microscale elements fabricated therein, which one or more microscale elements is fluidly coupled to first, second and third fluidic openings and which terminates at one end at the third fluidic opening;

a first, second and third electrode electrically connected to respectively the first, second and third fluidic openings of the microfluidic device;

at least one source of at least one electrically conductive buffer, fluidly coupled to the one or more microscale elements;

a fluid direction system which controllably moves the electrically conductive buffer through the one or more microscale elements;

an electrical controller which is electrically coupled to at least the first and second electrodes, wherein the electrical controller is operable to control a level of voltage or current applied to the at least first and second electrodes;

a detector which is operable to detect voltage or current at at least the third electrode in the third fluidic opening; and, system software comprising instructions which verify the function of the one or more microscale elements based upon information received from the detector.

12. The system of claim 11, wherein the third fluidic opening comprises an opening in a capillary element which is fluidly coupled to at least one source of fluidic material, which source is external to the microfluidic device.

13. The system of claim 11, wherein the fluid direction system comprises one or more of: an electroosmotic flow system, an electrophoretic flow system, a pressure based flow system, a wielding-based flow system, or a hydrostatic pressure-based flow system.

* * * * *